United States Patent
Kim et al.

(10) Patent No.: US 8,199,592 B2
(45) Date of Patent: Jun. 12, 2012

(54) SEMICONDUCTOR MEMORY DEVICES WITH MISMATCH CELLS

(75) Inventors: Jin-Young Kim, Seoul (KR); Chul-Woo Park, Yongin-si (KR); Ki-Whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 279 days.

(21) Appl. No.: 12/591,196

(22) Filed: Nov. 12, 2009

(65) Prior Publication Data

US 2010/0118631 A1    May 13, 2010

(30) Foreign Application Priority Data

Nov. 13, 2008    (KR) .................. 10-2008-0112635

(51) Int. Cl.
*G11C 7/00*        (2006.01)
(52) U.S. Cl. ..................... 365/203; 365/207; 365/210.1; 365/205

(58) Field of Classification Search .................. 365/203, 365/207, 210.1, 205, 189.011
See application file for complete search history.

(56) References Cited

U.S. PATENT DOCUMENTS

| | | | | |
|---|---|---|---|---|
| 7,495,983 B2 * | 2/2009 | Kim | .............................. | 365/205 |
| 7,502,270 B2 * | 3/2009 | Ohsawa | ........................ | 365/205 |

FOREIGN PATENT DOCUMENTS

| | | |
|---|---|---|
| KR | 10-2004-0007903 | 1/2004 |
| KR | 10-2006-0005626 | 1/2006 |
| KR | 10-0752669 | 8/2007 |

* cited by examiner

*Primary Examiner* — David Lam
(74) *Attorney, Agent, or Firm* — Harness, Dickey & Pierce, P.L.C.

(57) ABSTRACT

A semiconductor memory device having the mismatch cell makes a capacitance difference between a bit line pair relatively large during a read operation using at least one dummy memory cell as a mismatch cell selected together with a corresponding memory cell. Therefore, data of a semiconductor memory device may be detected more easily.

20 Claims, 5 Drawing Sheets

SEMICONDUCTOR MEMORY DEVICES WITH MISMATCH CELLS

CROSS-REFERENCE TO RELATED APPLICATION(S)

This application claims the benefit of priority under 35 U.S.C. §119 from Korean Patent Application No. 10-2008-0112635, filed on Nov. 13, 2008, the entire contents of which are hereby incorporated by reference.

BACKGROUND

1. Field

Example embodiments relate to semiconductor memory devices, and more particularly, semiconductor memory devices having a source voltage bit line pre-charge scheme.

2. Description of Related Art

In related art semiconductor memory devices, a source voltage VDD or VDD/2 is used as a bit line pre-charge voltage. Such related art semiconductor memory devices usually use a half VDD bit line pre-charge scheme in which VDD/2 is used as a bit line pre-charge voltage and potential variations of bit lines are symmetrical during a read operation regardless of a data value stored in a memory cell. However, as an operating voltage (a source voltage VDD) of a semiconductor memory device is gradually lowered, a threshold voltage of a cell transistor of a memory cell increases. As a result, accurately detecting data in semiconductor memory devices having a half VDD bit line pre-charge scheme becomes more difficult. Moreover, it is relatively difficult to lower a threshold voltage of a transistor, which configures a sense amplifier for detecting and amplifying a voltage of a bit line pair to suppress and/or prevent a leakage current. For this reason, a full VDD bit line pre-charge scheme in which VDD is used as a bit line pre-charge voltage and influence of a threshold voltage of a sense amplifying transistor is relatively small is preferred.

SUMMARY

Example embodiments provide semiconductor memory devices in which data is more easily detectable using a mismatch cell.

According to at least one example embodiment, a semiconductor memory device includes: a memory cell array, a sense amplifying unit and a pre-charger. The memory cell array includes a plurality of first memory cells and a plurality of second memory cells. The plurality of first memory cells are respectively connected between a plurality of bit lines and a plurality of first word lines. The plurality of second memory cells are respectively connected between a plurality of inverted bit lines and a plurality of second word lines. The memory cell array further includes a plurality of first mismatch cells and a plurality of second mismatch cells. The plurality of first mismatch cells are connected between the plurality of bit lines and at least one first mismatch enable line. The plurality of second mismatch cells are connected between the plurality of inverted bit lines and at least one second mismatch enable line.

According to at least this example embodiment, the sense amplifying unit includes a plurality of sense amplifiers configured to detect a voltage difference between the bit lines and the inverted bit lines in response to a sense enable signal, and amplify the voltage difference to one of a source voltage level and a ground voltage level. The pre-charger is configured to pre-charge the bit line pairs to the source voltage level in response to an equalizer signal.

According to at least one other example embodiment, a semiconductor memory device includes a first and second memory cell array. The first memory cell array includes a plurality of first memory cells respectively connected between a plurality of bit lines and a plurality of first word lines, and a plurality of first mismatch cells connected between the plurality of bit lines and at least one first mismatch enable line. The second memory cell array includes a plurality of second memory cells respectively connected between a plurality of inverted bit lines and a plurality of second word lines, and a plurality of second mismatch cells connected between the plurality of inverted bit lines and at least one second mismatch enable line. The semiconductor memory device further includes a sense amplifier. The sense amplifier is configured to detect a voltage difference between the bit lines and the inverted bit lines in response to a sense enable signal, and amplify the voltage difference between the bit lines and the inverted bit lines to one of a source voltage level and a ground voltage level. The semiconductor memory device may further include a pre-charger configured to pre-charge the bit line pairs to the source voltage level in response to an equalizer signal.

The first and second mismatch cells may be selected together with a corresponding memory cell of the first and second memory cells to increase a capacitance difference between the bit lines and the inverted bit lines during a read operation.

In at least some example embodiments, the first mismatch enable line may be activated during a pre-charge period before the first memory cell is selected and deactivated together with the first word lines. The second mismatch enable line may be activated during a pre-charge period before the second memory cell is selected and deactivated together with the second word lines.

According to at least some example embodiments, the first mismatch enable line may be activated together with the first word lines and deactivated during a pre-charge period after the first word lines are deactivated. The second mismatch enable line may be activated together with the second word lines and deactivated during a pre-charge period after the second word lines are deactivated.

According to at least one example embodiment, the sense amplifier may include: a PMOS sense amplifying unit and a NMOS sense amplifying unit. According to at least this example embodiment, the PMOS sense amplifying unit includes two PMOS transistors, which are cross connected between the bit lines and the inverted bit lines. The two PMOS transistors are activated in response to the sense enable signal and have the same or substantially the same current driving ability. The NMOS sense amplifying unit includes two NMOS transistors, which are cross connected between the bit lines and the inverted bit lines. The two NMOS transistors are activated in response to the inverted sense enable signal and have the same or substantially the same current driving ability.

In at least one alternative example embodiment, the sense amplifier includes: a PMOS sense amplifying unit, a first NMOS sense amplifying unit, and a second NMOS sense amplifying unit. The PMOS sense amplifying unit includes two PMOS transistors, which are cross connected between the bit lines and the inverted bit lines. The two PMOS transistors are activated in response to the sense enable signal and have the same or substantially the same current driving ability. The first NMOS sense amplifying unit includes two NMOS transistors, which are cross connected between the bit lines and the inverted bit lines. The two NMOS transistors are activated in response to a first inverted sense enable signal and have different current driving abilities. The second NMOS sense amplifying unit includes two NMOS transistors, which are cross connected between the bit lines and the inverted bit lines. These two NMOS transistors are activated in response to a second inverted sense enable signal and have different current driving abilities. During a read operation, the first inverted sense enable signal is activated prior to the second inverted sense enable signal when the first memory cell is selected, and the second inverted sense enable signal is activated prior to than the first inverted sense enable signal when the second memory cell is selected.

In yet another alternative example embodiment, the sense amplifier may include: an NMOS sense amplifying unit, a first PMOS sense amplifying unit, and a second PMOS sense amplifying unit. The first PMOS sense amplifying unit includes two NMOS transistors, which are cross connected between the bit lines and the inverted bit lines. The two NMOS transistors are activated in response to the inverted sense enable signal and have the same or substantially the same current driving ability. The first PMOS sense amplifying unit includes two PMOS transistors, which are cross connected between the bit lines and the inverted bit lines. The two PMOS transistors are activated in response to a first sense enable signal and have different current driving abilities. The second PMOS sense amplifying unit includes two PMOS transistors, which are cross connected between the bit lines and the inverted bit lines. The two PMOS transistors are activated in response to a second sense enable signal and have different current driving abilities. During a read operation, the first sense enable signal is activated prior to the second sense enable signal when the first memory cell is selected, and the second sense enable signal is activated prior to the first sense enable signal when the second memory cell is selected.

In at least some example embodiments, the at least one mismatch cell may have a threshold voltage lower than threshold voltages of the first and second memory cells to reduce an additional burden on a boosting voltage generating ability of the semiconductor memory device.

According to at least one example embodiment, the precharger includes first through third transistors. The first transistor is connected between one of the plurality of bit lines and corresponding one of the plurality of inverted bit lines. The second transistor is connected between the bit line and the source voltage level. The third transistor is connected between the inverted bit line and the source voltage level. A gate of each of the first, second and third transistors is configured to receive the equalizer signal.

According to at least some example embodiments, the semiconductor memory device further includes a bit line gate and an inverted bit line gate. The bit line gate selectively connects an input/output line with a bit line among the plurality of bit lines. The inverted bit line gate selectively connects an inverted input/output line with an inverted bit line among the plurality of inverted bit lines. Each of the bit line gate and inverted bit line gate is configured to be activated in response to a column selection signal CSL.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
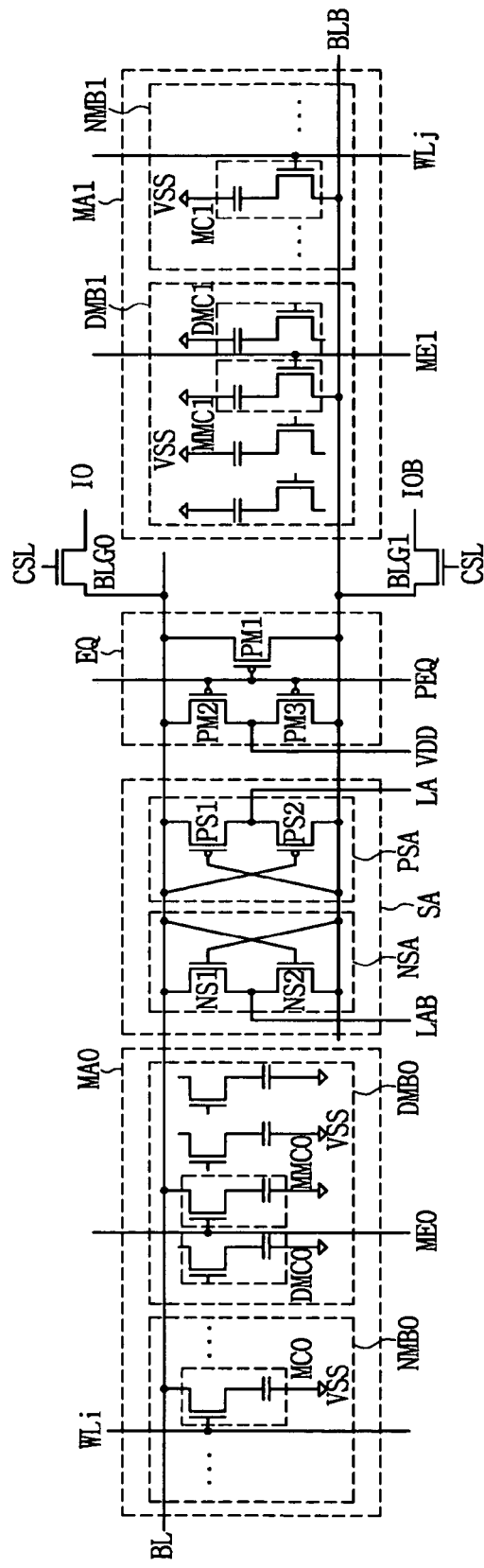
FIG. 1 is a view illustrating a semiconductor memory device having a VDD bit line pre-charge scheme according to an example embodiment.

Various example embodiments will now be described more fully with reference to the accompanying drawings in which some example embodiments are shown. In the drawings, the thicknesses of layers and/or regions may be exaggerated for clarity.

Detailed illustrative embodiments are disclosed herein. However, specific structural and functional details disclosed herein are merely representative for purposes of describing example embodiments. Example embodiments, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, example embodiments are not limited to those described.

FIG. 1 is a view illustrating a semiconductor memory device having a VDD bit line pre-charge scheme according to an example embodiment. A bit line pair among a plurality of bit line pairs is illustrated as part of a semiconductor memory device with an open bit line structure in FIG. 1.

Referring to FIG. 1, the semiconductor memory device includes at least a first memory cell array MA0 and at least a second memory cell array MA1. The first memory cell array MA0 has a plurality of memory cells connected to a bit line BL. The second memory cell array MA1 has a plurality of memory cells connected to an inverted bit line BLB. The semiconductor memory device further includes a pre-charger EQ and a sense amplifier (or sense amplifying unit) SA. The pre-charger EQ is configured to pre-charge a bit line pair BL and BLB to voltage level VDD. The sense amplifier SA is configured to detect and amplify a voltage difference between the bit line pair BL and BLB.

Still referring to the example embodiment shown in FIG. 1, the first memory cell array MA0 includes a first normal memory cell block NMB0 and a first dummy memory cell block DMB0. The second memory cell array MA1 includes a second normal memory cell block NMB1 and a second dummy memory cell block DMB1. The first normal memory cell block NMB0 includes a plurality of a first memory cells MC0 for storing data. The first dummy memory cell block DMB0 is disposed between the normal memory cell block NMB0 and a sense amplifier SA. The first dummy memory cell block DMB0 includes a plurality of a first dummy memory cells DMC0.

The second normal memory cell block NMB1 includes a plurality of a second memory cells MC1 for storing data, and the second dummy memory cell block DMB1 includes a plurality of a second dummy memory cells DMC1.

Each of the first memory cells MC0 of the first normal memory cell block NMB0 includes a cell transistor and a cell capacitor. The cell transistor and the cell capacitor of each first memory cell MC0 are serially connected between the bit line BL and a ground voltage VSS. A gate of the cell transistor is connected to a corresponding word line among a plurality of first word lines WLi.

Still referring to FIG. 1, each of the second memory cells MC1 of the second normal memory cell block NMB1 also includes a cell transistor and a cell capacitor. The cell transistor and the cell capacitor of each second memory cell MC1 are serially connected between the inverted bit line BLB and the ground voltage VSS. A gate of the cell transistor of each second memory cell MC1 is connected to a corresponding word line among a plurality of second word lines WLj.

Each of the first and second dummy memory cells DMC0 and DMC1 includes a dummy cell transistor and a dummy cell capacitor. Unlike the cell transistor and cell capacitor of the first and second memory cells MC0 and MC1, however, the first and second dummy memory cells DMC0 and DMC1 do not store data. As a result, data need not be applied to the first and second dummy memory cells DMC0 and DMC1, and the dummy cell transistors need not be activated. Therefore, the dummy cell transistor is not connected to the bit line pair BL and BLB, and a gate thereof is electrically opened. Typically, each of the first and second dummy memory cell blocks DMB0 and DMB1 includes a given, desired or predetermined number (e.g., 3 to 4) dummy memory cells.

Still referring to the example embodiment shown in FIG. 1, the pre-charger EQ includes a plurality of (e.g., three) equalizer transistors PM1 to PM3. The first equalizer transistor PM1 is connected between the bit line pair BL and BLB. The second equalizer transistor PM2 is connected between the bit line BL and the source voltage VDD. The third equalizer transistor PM3 is connected between the inverted bit line BLB and the source voltage VDD. An equalizer signal PEQ is applied to gates of the first to third equalizer transistors PM1 to PM3. When the equalizer signal PEQ is applied, the second and third equalizer transistors PM2 and PM3 pre-charge the bit line pair BL and BLB to a source voltage level VDD. Also, when the equalizer signal PEQ is applied, the first equalizer transistor PM1 equalizes voltage levels of the bit line BL and the inverted bit line BLB. In FIG. 1, the first to third equalizer transistors PM1 to PM3 are PMOS transistors, but NMOS transistors may be used.

Still referring to the example embodiment shown in FIG. 1, the sense amplifier SA includes a PMOS sense amplifier PSA and an NMOS sense amplifier NSA. The PMOS sense amplifier PSA includes two PMOS transistors PS1 and PS2. The two PMOS transistors PS1 and PS2 are cross-coupled between the bit line BL and the inverted bit line BLB. The PMOS transistors PS1 and PS2 are activated in response to a sense enable signal LA.

The NMOS sense amplifier NSA includes two NMOS transistors NS1 and NS2. The two NMOS transistors NS1 and NS2 are cross-coupled between the bit line BL and the inverted bit line BLB. The NMOS transistors NS1 and NS2 are activated in response to an inverted sense enable signal LAB.

In at least the example embodiment shown in FIG. 1, the two PMOS transistors PS1 and PS2 may have the same or substantially the same current driving ability. Similarly, the two NMOS transistors NS1 and NS2 may have the same or substantially the same current driving ability. The transistors PS1, PS2, NS1, and NS2 of the sense amplifier SA have a threshold voltage (e.g., about 0.3V) lower than a threshold voltage (e.g., about 0.7V) of the cell transistor. As a result, a voltage difference between the bit line BL and the inverted bit line BLB is be more easily detected and amplified.

Still referring to FIG. 1, two bit line gates BLG0 and BLG1 are activated in response to a column selection signal CSL. When activated, the bit line gate BLG0 connects an input/output (I/O) line IO with the bit line BL and the bit line gate BLG1 connects an inverted I/O line IOB with the inverted bit line BLB. As a result, output data is amplified through the sense amplifier SA from the bit line pair BL and BLB to the I/O line pair IO and IOB, respectively.

In a semiconductor memory device having a full VDD bit line pre-charge scheme, the sense amplifier SA detects and amplifies data more easily when data stored in the selected memory cell MC0 during a read operation is "0" because a voltage difference occurs between the bit line pair BL and BLB. However, when data stored in the selected memory cell MC0 is "1," it is more difficult for the sense amplifier SA to detect data because there is little or no voltage difference between the bit line pair BL and BLB pre-charged to a voltage level VDD.

Semiconductor memory devices such as the example embodiment illustrated in FIG. 1 use a dummy cell among the first dummy memory cells DMC0 and a dummy cell among the second dummy memory cells DMC1 as respective first and second mismatch cells MMC0 and MMC1 for more easily detecting data "1."

As shown in FIG. 1, gates of cell transistors of the first and second mismatch cells MMC0 and MMC1 are connected to first and second mismatch enable lines ME0 and ME1, respectively. The first and second mismatch enable lines ME0 and ME1 are activated during a pre-charge operation or a read operation of the semiconductor memory device. For example, the first mismatch enable line ME0 is activated when the first memory cell MC0 of the first normal memory cell block NMB0 is selected, whereas the second mismatch enable line ME1 is activated when the second memory cell MC1 of the second normal memory cell block NMB1 is selected. As a result, the first and second mismatch cells MMC0 and MMC1 are selected together with the first and second memory cells MC0 and MC1. That is, for example, when a memory cell among the plurality of memory cells MC0 and MC1 of the first and second normal memory cell block NMB0 and NMB1 is selected, the mismatch cells MMC0 and MMC1 of the corresponding memory cell array MA0 and MA1 are also selected (e.g., simultaneously or concurrently) so that a mismatch capacitance, in which capacitances of the bit line BL and the inverted bit line BLB are different, is induced.

Figure 2:
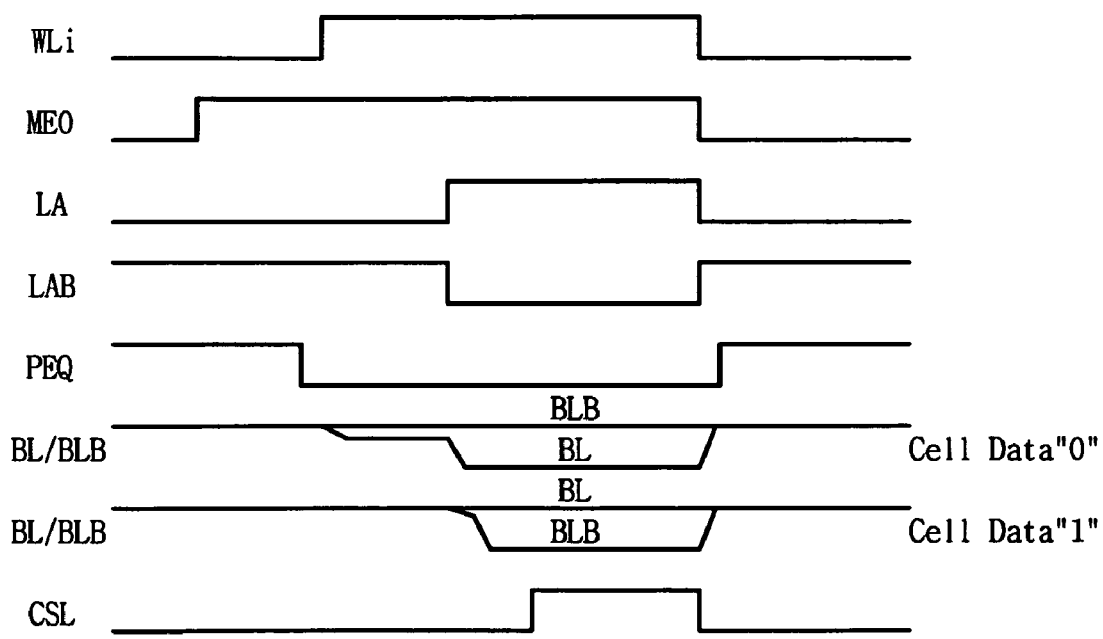
FIG. 2 is a view illustrating an example operation of the semiconductor memory device of FIG. 1.

FIG. 2 is a view illustrating an example operation of the semiconductor memory device of FIG. 1.

Referring to FIGS. 1 and 2, a controller (not shown) of the semiconductor memory device activates the pre-charge enable signal PEQ to pre-charge the bit line pair BL and BLB to a voltage level VDD during a pre-charge operation. When an address is externally applied (e.g., applied from an external device) together with a read operation, an address register (not shown) of the semiconductor memory device classifies the address and outputs a row address and a column address.

A row decoder (not shown) receives and decodes a row address. The row decoder then activates the first mismatch enable line ME0 to store data "1" in the first mismatch cell MMC0 during a pre-charge period when the decoded row address indicates the first memory cell array MA0.

When the pre-charge period is finished, the row decoder activates a first word line among the plurality of first word lines WLi in response to a row address.

When data "1" is stored in the first memory cell MC0 selected by the activated word line WLi, both a voltage of the bit line BL and a voltage of the inverted bit line BLB have a voltage level VDD. When a sense enable signal LA and an inverted sense enable signal LAB are activated, the PMOS sense amplifier PSA and the NMOS sense amplifier NSA of the sense amplifier SA are activated. Because voltage levels of the bit line pair BL and BLB are at voltage level VDD, the sense amplifier SA is unable to detect a voltage difference between the bit line pair BL and BLB.

Because there is no activated memory cell MC0 in the second memory cell array MA1, there is no cell capacitor connected to the inverted bit line BLB. However, in the first memory cell array MA0 two cell capacitors are connected because the first memory cell MC0 and the first mismatch cell MMC0 are activated. Therefore, a capacitance mismatch occurs between the bit line pairs BL and BLB due to the two cell capacitors. Because capacitance of the bit line BL is larger than capacitance of the inverted bit line BLB, when the sense amplifier SA is activated, a voltage level of the bit line BL drops relatively slowly compared to a voltage level of the inverted bit line BLB. Therefore, an electric current flowing through a PMOS transistor PS2 and an NMOS transistor NS2 becomes greater than an electric current flowing through a PMOS transistor PS1 and an NMOS transistor NS1. As a result, a voltage of the inverted bit line BLB drops faster than a voltage of the bit line BL and a voltage difference occurs between the bit line pair BL and BLB. The sense amplifier SA detects the voltage difference between the bit line pair BL and BLB and amplifies the bit line BL to a voltage level VDD and the inverted bit line BLB to a voltage level VSS.

According to at least some example embodiments, a VDD bit line pre-charge scheme is used due to a threshold voltage problem of the transistors NS1, NS2, PS1, and PS2 of the sense amplifier SA. Further, a VDD bit line pre-charge scheme does not perform charge sharing because the bit line BL and the inverted bit line BLB have the same or substantially the same voltage level (e.g., voltage level VDD) when reading data "1."

According to at least one example embodiment, a capacitance mismatch occurs between the bit line BL and the inverted bit line BLB because the first mismatch cell MMC0 is activated together with the first memory cell MC0. Thus, when the sense amplifier SA operates, a relatively large capacitance side drops in voltage level relatively slowly and a relatively small capacitance side drops in voltage level more rapidly so that data "1" may be detected more easily.

When data "0" exists in the memory cell MC0 selected by the activated word line WLi, the first memory cell MC0 performs charge sharing with the bit line BL. A voltage of the bit line BL pre-charged to a voltage level VDD drops (VDD-ΔV) due to charge sharing, but the inverted bit line BLB maintains the voltage level VDD. Thereafter, when the sense enable signal LA and the inverted sense enable signal LAB are activated, the PMOS sense amplifier PSA and the NMOS sense amplifier NSA of the sense amplifier SA detect a voltage difference ΔV of the bit line pair BL and BLB, respectively, and amplify the bit line to a voltage level VSS and the inverted bit line BLB to a voltage level VDD.

After a voltage difference of the bit line pair BL and BLB is amplified by the sense amplifier SA, a column decoder (not shown) decodes a column address to activate a column selecting line CSL corresponding to a column address. The bit line gates BLG0 and BLG1 transfer voltages of the bit line pair BL and BLB to the I/O line pair IO and IOB in response to the activated column selecting line CSL.

A semiconductor memory device according to at least this example embodiment stores data of the mismatch cells MMC0 and MMC1 corresponding to the memory cells MC0 and MC1 selected during a read operation as "1" in advance (during a pre-charge operation) and selects the mismatch cells MMC0 and MMC1 together with the memory cells MC0 and MC1 selected during a read operation. Therefore, the mismatch cells MMC0 and MMC1 together with the memory cells MC0 and MC1 selected during a read operation make a capacitance difference of the bit line pair BL and BLB relatively large, so that the sense amplifier SA more easily detects and amplifies data when data of the selected memory cell(s) MC0 and MC1 are "1."

Figure 3:
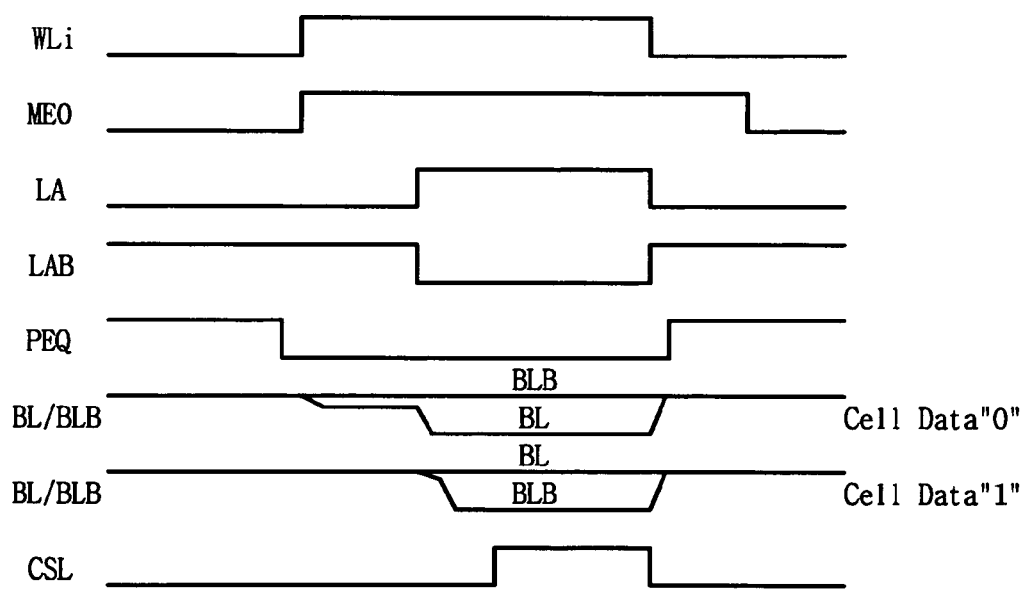
FIG. 3 is a view illustrating another example operation of the semiconductor memory device of FIG. 1.

FIG. 3 is a view illustrating another example operation of the semiconductor memory device of FIG. 1.

In FIG. 2, the mismatch enable lines ME0 and ME1 are activated during a pre-charge period before a read operation and are deactivated together with the word lines WLi and WLj when the read operation is complete. However, as shown in FIG. 3, the mismatch enable lines ME0 and ME1 may be enabled together with the word lines WLi and WLj during a read operation, activated during a pre-charge period after a read operation and then deactivated. In this example, data "1" is stored in the mismatch cells MMC0 and MMC1 during a read operation.

The mismatch cells MMC0 and MMC1 are not memory cells for storing data, but memory cells for inducing a capacitance difference between the bit line pair BL and BLB. In at least this example embodiment, capacitances of the cell capacitors of the mismatch cells MMC0 and MMC1 are more easily transferred to the bit line pair BL and BLB. Therefore, the cell transistors of the mismatch cells MMC0 and MMC1 may be formed to have a relatively low threshold voltage similar to the transistors NS1, NS2, PS1, and PS2 of the sense amplifier SA. When the cell transistors of the mismatch cells MMC0 and MMC1 have a relatively low threshold voltage, an additional burden is not imposed on a boosting voltage generating ability of the semiconductor memory device because the mismatch cells MMC0 and MMC1 may be activated by applying a voltage lower than the word lines WLi and WLj, which are activated by the boosting voltage.

Threshold voltages of the mismatch cells MMC0 and MMC1 may be adjusted using masking together with the sense amplifier SA during an ion injection process for adjusting threshold voltages of the memory cells MC0 and MC1 of the memory cell arrays MA0 and MA1. Because the dummy memory cell blocks DMB0 and DMB1 are disposed adjacent to the sense amplifier SA and the dummy memory cells DMC0 and DMC1 are not used, process convenience may be achieved by masking the dummy memory cell blocks DMB0 and DMB1 including the mismatch cells MMC0 and MMC1.

According to at least some example embodiments, the mismatch cells MMC0 and MMC1 may be formed in a sense amplifier SA area other than an area of the memory cell arrays MA0 and MA1.

Figure 4:
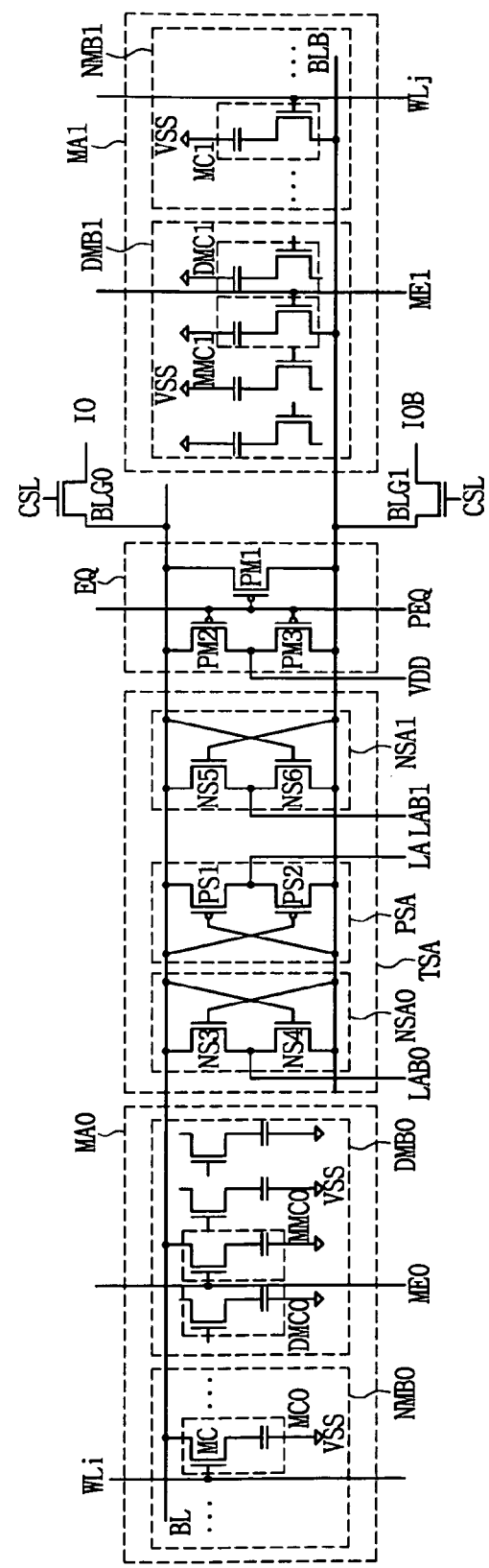
FIG. 4 is a view illustrating a semiconductor memory device having a VDD bit line pre-charge scheme according to another example embodiment.

FIG. 4 is a view illustrating a semiconductor memory device having a VDD bit line pre-charge scheme according to another example embodiment. The semiconductor memory device of FIG. 4 uses the mismatch cells MMC0 and MMC1 similar the semiconductor memory device of FIG. 1. However, a sense amplifier TSA of the semiconductor memory device of FIG. 4 is configured differently from that of the semiconductor memory device shown in FIG. 1. Because the semiconductor memory device of FIG. 4 is similar to the semiconductor memory device of FIG. 1, but for the sense amplifier TSA, a detailed description of the similar components will be omitted.

Referring to FIG. 4, the sense amplifier TSA includes a PMOS sense amplifier PSA and two NMOS sense amplifiers NSA0 and NSA1. The PMOS sense amplifier PSA includes two PMOS transistors PS1 and PS2. The PMOS transistors PS1 and PS2 are cross-connected between the bit line BL and the inverted bit line BLB, and activated in response to a sense enable signal LA like the PMOS sense amplifier of FIG. 1. The two PMOS transistors PS1 and PS2 are designed to have the same or substantially the same current driving ability.

The NMOS sense amplifier NSA0 includes two NMOS transistors NS3 and NS4. The NMOS transistors NS3 and NS4 are cross-connected between the bit line BL and the inverted bit line BLB, and activated in response to a first inverted sense enable signal LAB0.

The NMOS sense amplifier NSA1 includes two NMOS transistors NS5 and NS6. The NMOS transistors NS5 and NS6 are cross-connected between the bit line BL and the inverted bit line BLB, and activated in response to a second inverted sense enable signal LAB 1.

According to at least this example embodiment, the two NMOS transistors NS3 and NS4 of the first NMOS sense amplifier NSA0 are designed to have different current driving abilities, and the two NMOS transistors NS5 and NS6 of the second NMOS sense amplifier NSA1 are designed to have different current driving abilities. For example, in the first NMOS sense amplifier NSA0, the NMOS transistor NS3 for driving the bit line BL is designed to have a current driving ability smaller than the NMOS transistor NS4 for driving the inverted bit line BLB. In the second NMOS sense amplifier NSA1, the NMOS transistor NS5 for driving the bit line BL is designed to have a current driving ability larger than the NMOS transistor NS6 for driving the inverted bit line BLB.

In example operation, the first NMOS sense amplifier NSA0 and the second NMOS sense amplifier NSA1 may be activated sequentially with a given, desired or predetermined time difference in response to the first and second inverted sense enable signals LAB0 and LAB1, respectively. An order in which the first and second NMOS sense amplifiers NSA0 and NSA1 depends on the memory cells MC0 and MC1, which are selected in response to a row address.

When one of the plurality of first memory cells MC0 of the first normal memory cell block NMB0 is selected, the first NMOS sense amplifier NSA0 is activated earlier than (e.g., prior to) the second NMOS sense amplifier NSA1. When one of the plurality of second memory cells MC1 of the second normal memory cell block NMB1 is selected, the second NMOS sense amplifier NSA1 is activated earlier than (e.g., prior to) the first NMOS sense amplifier NSA0.

An example read operation of the semiconductor memory device of FIG. 4 will be described in more detail below.

During a pre-charge operation, the bit line pair BL and BLB is pre-charged to a voltage level VDD. The mismatch enable lines ME0 and ME1 of the memory cell arrays MA0 and MA1 corresponding to a row address are also activated during the pre-charge operation as in the semiconductor memory device of FIG. 1. When a memory cell array designated by a row address is the first memory cell array MA0, the first mismatch enable line ME0 is activated during a pre-charge operation so that data "1" is stored in the first mismatch cell MMC0. When a first word line among the plurality of first word lines WLi is activated, the first memory cell MC0 corresponding to the activated word line performs charge sharing with the bit line BL.

Because the first memory cell MC0 is selected, the first inverted sense enable signal LAB0 is activated, and then the sense enable signal LA and the second inverted enable signal LAB1 is activated.

When data stored in the first memory cell MC0 is "0," even if the NMOS transistor NS3 of the first NMOS sense amplifier NSA0 is smaller in current driving ability than the NMOS transistor NS4, an electric current flowing through the NMOS transistor NS3 increases more than an electric current flowing through the NMOS transistor NS4 due to a voltage difference between the bit line pair BL and BLB. As a result, a voltage difference between the bit line pair BL and BLB is amplified.

When data stored in the first memory cell MC0 is "1," there is little or no voltage difference between the bit line pair BL and BLB. But, a voltage level of the inverted bit line BLB drops more rapidly than the bit line BL because a capacitance difference between the bit line pair BL and BLB is induced due to a cell capacitance of the first memory cell MC0, and a cell capacitance of the mismatch cell MMC0 and the NMOS transistor NS4 is larger in current driving ability than the NMOS transistor NS3. Therefore, a voltage difference between the bit line pair BL and BLB occurs and is amplified.

Thereafter, the sense enable signal LA and the second inverted enable signal LAB 1 are activated to further amplify a voltage difference between the bit line pair BL and BLB.

Figure 5:
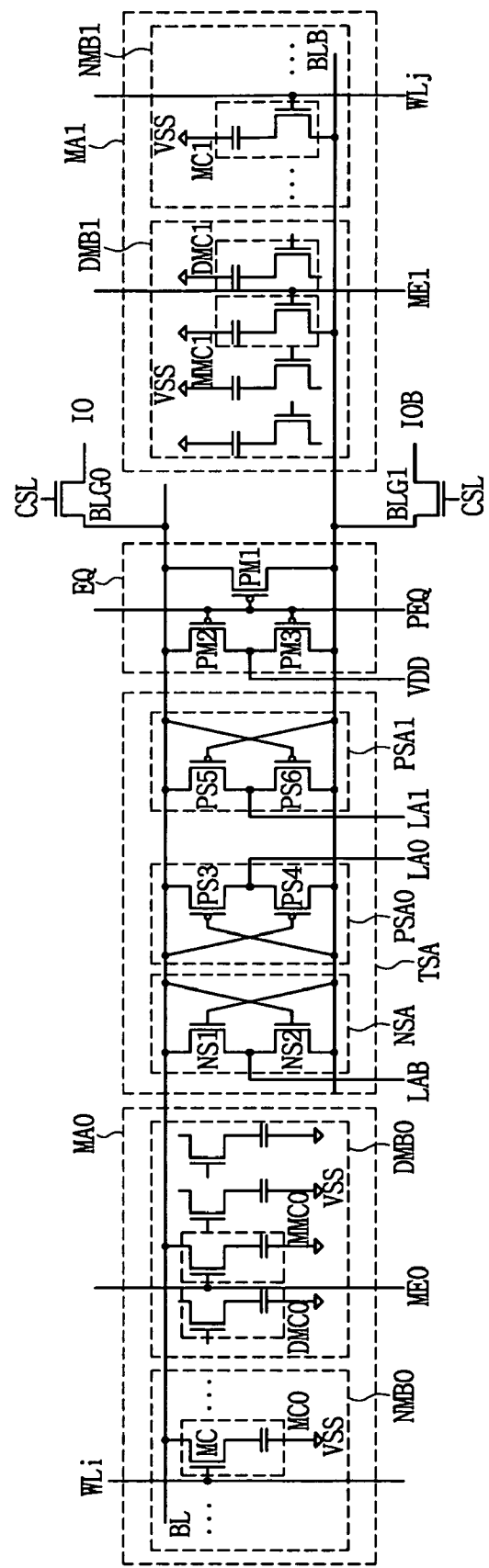
FIG. 5 is a view illustrating a semiconductor memory device having a VDD bit line pre-charge scheme according to still another example embodiment.

FIG. 5 is a view illustrating a semiconductor memory device having a VDD bit line pre-charge scheme according to yet another example embodiment.

In FIG. 4, the sense amplifier TSA includes the two NMOS sense amplifiers NSA0 and NSA1. However, in a semiconductor memory device of FIG. 5, the sense amplifier TSA includes one NMOS sense amplifier NSA and two PMOS sense amplifiers PSA0 and PSA1. Two NMOS transistors NS1 and NS2 are designed to have the same or substantially the same current driving ability. The PMOS transistors PS3 and PS4 of the first PMOS sense amplifier PSA0 are designed to have different current driving abilities from each other, and the PMOS transistors PS5 and PS6 of the second PMOS sense amplifier PSA1 are designed to have different current driving abilities from each other.

For example, in the first PMOS sense amplifier PSA0, the PMOS transistor PS3 for driving the bit line BL is designed to have a current driving ability larger than the PMOS transistor PS4 for driving the inverted bit line BLB. In the second PMOS sense amplifier PSA1, the PMOS transistor PS5 for driving the bit line BL is designed to have a current driving ability smaller than the PMOS transistor PS6 for driving the inverted bit line BLB. The first PMOS sense amplifier PSA0 and the second PMOS sense amplifier PSA1 may be activated sequentially with a given, desired or predetermined time difference in response to respective first and second sense enable signals LA0 and LA1.

Although not shown, according to at least some example embodiments, the sense amplifier SA may include two NMOS sense amplifiers and two PMOS sense amplifiers.

Semiconductor memory devices with an open bit line structure are shown and described above, but example embodiments may be applied to semiconductor memory devices with a folded bit line structure.

According to at least some example embodiments, a semiconductor memory device with a mismatch cell may more accurately read data regardless of a value of data stored in a memory cell by making a capacitance difference of the bit line pair relatively large. Because a sensing margin is relatively large, a malfunction resulting from a processing error may be suppressed and/or prevented.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a first memory cell array including,
     a plurality of first memory cells respectively connected between a plurality of bit lines and a plurality of first word lines, and
     a plurality of first mismatch cells connected between the plurality of bit lines and at least one first mismatch enable line, at least one of the plurality of first mismatch cells being configured to be selected together with a corresponding first memory cell;
   a second memory cell array including,
     a plurality of second memory cells respectively connected between a plurality of inverted bit lines and a plurality of second word lines, and
     a plurality of second mismatch cells connected between the plurality of inverted bit lines and at least one second mismatch enable line, at least one of the plurality of second mismatch cells being configured to be selected together with a corresponding second memory cell; and
   a sense amplifier configured to detect a voltage difference between the bit lines and the inverted bit lines in response to a sense enable signal, the sense amplifier being further configured to amplify the voltage difference between the bit lines and the inverted bit lines to one of a source voltage level and a ground voltage level.

2. The semiconductor memory device of claim 1, further comprising:
   a pre-charger configured to pre-charge pairs of bit lines and corresponding inverted bit lines to the source voltage level in response to an equalizer signal.

3. The semiconductor memory device of claim 1, wherein the first and second mismatch cells are selected together with the corresponding first and second memory cell to increase a capacitance difference between the bit lines and the inverted bit lines during a read operation.

4. The semiconductor memory device of claim 3, wherein the first mismatch enable line is activated during a pre-charge period before the first memory cell is selected and deactivated together with the first word lines, and the second mismatch enable line is activated during a pre-charge period before the second memory cell is selected and deactivated together with the second word lines.

5. The semiconductor memory device of claim 3, wherein the first mismatch enable line is activated together with the first word lines and deactivated during a pre-charge period after the first word lines are deactivated, and the second mismatch enable line is activated together with the second word lines and deactivated during a pre-charge period after the second word lines are deactivated.

6. The semiconductor memory device of claim 1, wherein the sense amplifier comprises:
   a PMOS sense amplifying unit including two PMOS transistors, which are cross connected between the bit lines and the inverted bit lines, the two PMOS transistors being activated in response to the sense enable signal and having the same current driving ability; and
   an NMOS sense amplifying unit including two NMOS transistors, which are cross connected between the bit lines and the inverted bit lines, the two NMOS transistors being activated in response to the inverted sense enable signal and having the same current driving ability.

7. The semiconductor memory device of claim 6, further comprising:
   a pre-charger configured to pre-charge pairs of bit lines and corresponding inverted bit lines to the source voltage level in response to an equalizer signal.

8. The semiconductor memory device of claim 7, wherein the pre-charger comprises:
   a first transistor connected between one of the plurality of bit lines and corresponding one of the plurality of inverted bit lines;
   a second transistor connected between the bit line and the source voltage level; and
   a third transistor connected between the inverted bit line and the source voltage level; wherein
      a gate of each of the first, second and third transistors is configured to receive the equalizer signal.

9. The semiconductor memory device of claim 6, further comprising:
   a bit line gate selectively connecting an input/output line with a bit line among the plurality of bit lines; and
   an inverted bit line gate selectively connecting an inverted input/output line with an inverted bit line among the plurality of inverted bit lines; wherein
   each of the bit line gate and inverted bit line gate is configured to be activated in response to a column selection signal.

10. The semiconductor memory device of claim 1, wherein the sense amplifier comprises:
    a PMOS sense amplifying unit including two PMOS transistors, which are cross connected between the bit lines and the inverted bit lines, the two PMOS transistors being activated in response to the sense enable signal and having the same current driving ability;
    a first NMOS sense amplifying unit including two NMOS transistors, which are cross connected between the bit lines and the inverted bit lines, the two NMOS transistors of the first NMOS sense amplifying unit being activated in response to a first inverted sense enable signal and having different current driving abilities; and
    a second NMOS sense amplifying unit including two NMOS transistors, which are cross connected between the bit lines and the inverted bit lines, the two NMOS transistors of the second NMOS sense amplifying unit being activated in response to a second inverted sense enable signal and having different current driving abilities; wherein
       during a read operation, the first inverted sense enable signal is activated before the second inverted sense enable signal when the first memory cell is selected, and
       the second inverted sense enable signal is activated before the first inverted sense enable signal when the second memory cell is selected.

11. The semiconductor memory device of claim 10, further comprising:
    a pre-charger configured to pre-charge pairs of bit lines and corresponding inverted bit lines to the source voltage level in response to an equalizer signal.

12. The semiconductor memory device of claim 11, wherein the pre-charger comprises:
    a first transistor connected between one of the plurality of bit lines and corresponding one of the plurality of inverted bit lines;
    a second transistor connected between the bit line and the source voltage level; and
    a third transistor connected between the inverted bit line and the source voltage level; wherein
       a gate of each of the first, second and third transistors is configured to receive the equalizer signal.

13. The semiconductor memory device of claim 10, further comprising:
    a bit line gate selectively connecting an input/output line with a bit line among the plurality of bit lines; and
    an inverted bit line gate selectively connecting an inverted input/output line with an inverted bit line among the plurality of inverted bit lines; wherein
       each of the bit line gate and inverted bit line gate is configured to be activated in response to a column selection signal.

14. The semiconductor memory device of claim 1, wherein the sense amplifier comprises:
    an NMOS sense amplifying unit including two NMOS transistors, which are cross connected between the bit lines and the inverted bit lines, the two NMOS transistors being activated in response to the inverted sense enable signal and having the same current driving ability;
    a first PMOS sense amplifying unit including two PMOS transistors, which are cross connected between the bit lines and the inverted bit lines, the two PMOS transistors of the first PMOS sense amplifying unit being activated in response to a first sense enable signal and having different current driving abilities; and
    a second PMOS sense amplifying unit including two PMOS transistors, which are cross connected between the bit lines and the inverted bit lines, the two PMOS transistors of the second PMOS sense amplifying unit being activated in response to a second sense enable signal and having different current driving abilities; wherein
       during a read operation, the first sense enable signal is activated before the second sense enable signal when the first memory cell is selected, and
       the second sense enable signal is activated before the first sense enable signal when the second memory cell is selected.

15. The semiconductor memory device of claim 14, further comprising:
    a pre-charger configured to pre-charge pairs of bit lines and corresponding inverted bit lines to the source voltage level in response to an equalizer signal.

16. The semiconductor memory device of claim 15, wherein the pre-charger comprises:

a first transistor connected between one of the plurality of bit lines and corresponding one of the plurality of inverted bit lines;

a second transistor connected between the bit line and the source voltage level; and a third transistor connected between the inverted bit line and the source voltage level; wherein a gate of each of the first, second and third transistors is configured to receive the equalizer signal.

17. The semiconductor memory device of claim 14, further comprising:

a bit line gate selectively connecting an input/output line with a bit line among the plurality of bit lines; and an inverted bit line gate selectively connecting an inverted input/output line with an inverted bit line among the plurality of inverted bit lines; wherein each of the bit line gate and inverted bit line gate is configured to be activated in response to a column selection signal.

18. The semiconductor memory device of claim 1, further comprising:

a bit line gate selectively connecting an input/output line with a bit line among the plurality of bit lines; and an inverted bit line gate selectively connecting an inverted input/output line with an inverted bit line among the plurality of inverted bit lines; wherein each of the bit line gate and inverted bit line gate is configured to be activated in response to a column selection signal.

19. A semiconductor memory device, comprising:

a first memory cell array including,
a plurality of first memory cells respectively connected between a plurality of bit lines and a plurality of first word lines, and
a plurality of first mismatch cells connected between the plurality of bit lines and at least one first mismatch enable line;

a second memory cell array including,
a plurality of second memory cells respectively connected between a plurality of inverted bit lines and a plurality of second word lines, and
a plurality of second mismatch cells connected between the plurality of inverted bit lines and at least one second mismatch enable line;

a sense amplifier configured to detect a voltage difference between the bit lines and the inverted bit lines in response to a sense enable signal, the sense amplifier being further configured to amplify the voltage difference between the bit lines and the inverted bit lines to one of a source voltage level and aground voltage level; and a pre-charger configured to pre-charge pairs of bit lines and corresponding inverted bit lines to the source voltage level in response to an equalizer signal, the pre-charger including,
a first transistor connected between one of the plurality of bit lines and corresponding one of the plurality of inverted bit lines,
a second transistor connected between the bit line and the source voltage level, and
a third transistor connected between the inverted bit line and the source voltage level, wherein
a gate of each of the first, second and third transistors is configured to receive the equalizer signal.

20. A semiconductor memory device, comprising:

a first memory cell array including,
a plurality of first memory cells respectively connected between a plurality of bit lines and a plurality of first word lines, and
a plurality of first mismatch cells connected between the plurality of bit lines and at least one first mismatch enable line;

a second memory cell array including,
a plurality of second memory cells respectively connected between a plurality of inverted bit lines and a plurality of second word lines, and
a plurality of second mismatch cells connected between the plurality of inverted bit lines and at least one second mismatch enable line; and a sense amplifier configured to detect a voltage difference between the bit lines and the inverted bit lines in response to a sense enable signal, the sense amplifier being further configured to amplify the voltage difference between the bit lines and the inverted bit lines to one of a source voltage level and a ground voltage level; wherein at least one mismatch cell has a threshold voltage lower than threshold voltages of the first and second memory cells to reduce an additional burden on a boosting voltage generating ability of the semiconductor memory device.

* * * * *